(12) United States Patent
Choi et al.

(10) Patent No.: US 8,471,640 B2
(45) Date of Patent: Jun. 25, 2013

(54) OSCILLATORS AND METHODS OF OPERATING THE SAME

(75) Inventors: Hyun-sik Choi, Hwaseong-si (KR);
Ho-jung Kim, Suwon-si (KR);
Jai-kwang Shin, Anyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 118 days.

(21) Appl. No.: 13/064,627

(22) Filed: Apr. 5, 2011

(65) Prior Publication Data
US 2012/0112796 A1 May 10, 2012

(30) Foreign Application Priority Data

Nov. 9, 2010 (KR) .................. 10-2010-0111000

(51) Int. Cl.
*H03B 17/00* (2006.01)
(52) U.S. Cl.
USPC ........................................ 331/94.1; 331/185
(58) Field of Classification Search
USPC ..................... 331/94.1, 108 R, 185
See application file for complete search history.

(56) References Cited

U.S. PATENT DOCUMENTS

| | | | |
|---|---|---|---|
| 6,560,077 B2 | 5/2003 | Fujiwara et al. |
| 7,054,119 B2 | 5/2006 | Sharma et al. |
| 7,057,921 B2 | 6/2006 | Valet |
| 7,088,609 B2 | 8/2006 | Valet |
| 7,161,829 B2 | 1/2007 | Huai et al. |
| 7,440,314 B2 | 10/2008 | Sakimura et al. |
| 7,466,526 B2 | 12/2008 | Sato et al. |
| 7,504,898 B2 | 3/2009 | Fukuzawa et al. |
| 7,589,600 B2 | 9/2009 | Dimitrov et al. |
| 7,610,674 B2 | 11/2009 | Zhang et al. |
| 7,616,412 B2 | 11/2009 | Zhu et al. |
| 7,732,881 B2 | 6/2010 | Wang |
| 7,965,474 B2 | 6/2011 | Sato et al. |
| 7,994,865 B1 * | 8/2011 | Manstretta et al. ........... 330/301 |
| 2002/0054461 A1 | 5/2002 | Fujiwara et al. |
| 2004/0257717 A1 | 12/2004 | Sharma et al. |
| 2005/0063222 A1 | 3/2005 | Huai et al. |
| 2005/0254286 A1 | 11/2005 | Valet |
| 2005/0254287 A1 | 11/2005 | Valet |

(Continued)

FOREIGN PATENT DOCUMENTS

| | | |
|---|---|---|
| JP | 2006-319259 | 11/2006 |
| JP | 2007-305629 | 11/2007 |

(Continued)

OTHER PUBLICATIONS

Office Action for corresponding U.S. Appl. No. 12/929,388 dated Mar. 28, 2012.

(Continued)

*Primary Examiner* — Joseph Chang
(74) *Attorney, Agent, or Firm* — Harness, Dickey & Pierce, P.L.C.

(57) ABSTRACT

Oscillators and methods of operating the oscillators are provided, the oscillators include an oscillating unit including at least one magnetic layer having a magnetization direction that varies according to at least one selected from the group consisting of an applied current, an applied voltage and an applied magnetic field. The oscillating unit is configured to generate an oscillation signal having a set frequency. The oscillators further include an output stage that provides an output signal by differentially amplifying the oscillation signal.

19 Claims, 12 Drawing Sheets

U.S. PATENT DOCUMENTS

| | | | |
|---|---|---|---|
| 2006/0256484 A1 | 11/2006 | Sato et al. | |
| 2007/0047294 A1 | 3/2007 | Panchula | |
| 2007/0109147 A1 | 5/2007 | Fukuzawa et al. | |
| 2007/0188936 A1 | 8/2007 | Zhang et al. | |
| 2007/0259209 A1 | 11/2007 | Slavin et al. | |
| 2008/0019040 A1 | 1/2008 | Zhu et al. | |
| 2008/0074806 A1 | 3/2008 | Sato et al. | |
| 2008/0150640 A1 | 6/2008 | Dimitrov et al. | |
| 2008/0150643 A1 | 6/2008 | Suzuki et al. | |
| 2008/0241597 A1 | 10/2008 | Dieny et al. | |
| 2009/0050991 A1 | 2/2009 | Nagai et al. | |
| 2009/0080106 A1 | 3/2009 | Shimizu et al. | |
| 2009/0097169 A1* | 4/2009 | Sato et al. | 360/324.2 |
| 2009/0097170 A1 | 4/2009 | Sato et al. | |
| 2009/0168501 A1 | 7/2009 | Ito | |
| 2009/0201614 A1 | 8/2009 | Kudo et al. | |
| 2009/0244792 A1 | 10/2009 | Nakayama et al. | |
| 2009/0302953 A1 | 12/2009 | Xi et al. | |
| 2009/0303779 A1 | 12/2009 | Chen et al. | |
| 2010/0039105 A1 | 2/2010 | Ryan et al. | |
| 2010/0039181 A1 | 2/2010 | Firastrau et al. | |
| 2010/0103730 A1 | 4/2010 | Shin | |
| 2010/0308923 A1* | 12/2010 | Kaka | 331/46 |
| 2011/0260270 A1 | 10/2011 | Zhang et al. | |
| 2011/0280340 A1 | 11/2011 | Pasanen et al. | |
| 2012/0038428 A1* | 2/2012 | Lee et al. | 331/108 R |

FOREIGN PATENT DOCUMENTS

| | | | |
|---|---|---|---|
| JP | 2008-053915 | | 3/2008 |
| JP | 2008-084879 | | 4/2008 |
| JP | 2009-094226 | | 4/2009 |
| JP | 2009-099741 | | 5/2009 |
| JP | 2009-135471 | | 6/2009 |
| JP | 2009-277704 | | 11/2009 |
| KR | 2004-0055384 | | 6/2004 |
| KR | 10-0697779 | | 3/2007 |
| KR | 10-0827497 | | 5/2008 |
| KR | 10-0866973 | | 11/2008 |
| KR | 2009-0011247 | | 2/2009 |
| KR | 2009-0031819 | A | 3/2009 |
| KR | 2009-0044575 | | 5/2009 |
| KR | 2009-0071404 | A | 7/2009 |
| KR | 2009-0087825 | A | 8/2009 |
| KR | 2009-0102676 | | 9/2009 |
| KR | 2009-0119253 | A | 11/2009 |

OTHER PUBLICATIONS

Office Action for corresponding U.S. Appl. No. 12/929,932 dated Apr. 24, 2012.

Office Action for corresponding U.S. Appl. No. 13/099,684 dated May 3, 2012.

Yoshida, et al.; "Unipolar resistive switching in CoFeB/MgO/CoFeB magnetic tunnel junction," *Applied Physics Letters*, vol. 92, pp. 113508-1-113508-3 (2008).

Houssameddine, et al.; "Spin transfer induced coherent microwave emission with large power from nanoscale MgO tunnel junctions," *Applied Physics Letters*, vol. 93, pp. 022505-1-022505-3 (2008).

Dimitrov, et al.; "Dielectric breakdown of MgO magnetic tunnel junctions," *Applied Physics Letters*, vol. 94, pp. 123110-1-113110-3 (Mar. 26, 2009).

Kiselev, et al.; "Microwave oscillations of a nanomagnet driven by a spin-polarized current," *Nature*, vol. 425, pp. 380-383 (Sep. 25, 2003).

Kaka, et al., "Mutual phase-locking of microwave spin torque nano-oscillators," *Nature*, vol. 427, pp. 389-392 (Sep. 15, 2005).

Deac, et al., "Bias-driven high-power microwave emission from MgO-based tunnel magnetoresistance devices," *Nature Physics*, vol. 4, pp. 803-809 (Aug. 10, 2008).

Georges, et al., "Origin of the spectral linewidth in nonlinear spin-transfer oscillators based on MgO tunnel junctions," *Physical Review*, vol. 80, pp. 060404-1-060404-4 (Aug. 31, 2009).

Rippard, et al., "Direct-Current Induced Dynamics in $Co_{90}Fe_{10}$/$Ni_{80}Fe_{20}$ Point Contacts," *Physical Review Letters*, vol. 92, No. 2, pp. 027201-1-027201-4 (Jan. 16, 2004).

Kent, *A Nanomagnet Oscillator*, Nature Publishing Group, vol. 6, II. 399-400 (Jun. 2007).

Office Action dated Aug. 22, 2012 for U.S. Appl. No. 13/099,684.
Office Action dated Sep. 5, 2012 for U.S. Appl. No. 13/096,627.
Office Action dated Jan. 10, 2013 issued in U.S. Appl. No. 13/174,932.

* cited by examiner

OSCILLATORS AND METHODS OF OPERATING THE SAME

CROSS-REFERENCE TO RELATED APPLICATIONS

This application claims the benefit of priority from Korean Patent Application No. 10-2010-0111000, filed on Nov. 9, 2010, in the Korean Intellectual Property Office, the disclosure of which is incorporated herein by reference in its entirety.

BACKGROUND

1. Field

Example embodiments relate to oscillators, and more particularly, to oscillators having variable frequency and methods of operating the oscillators.

2. Description of the Related Art

Oscillators generate signals having a constant frequency and may be used in wireless communication systems (e.g., a mobile communication terminal, a satellite and radar communication device), a wireless network device, a communication device for a vehicle, etc., or analog sound synthesizers. Oscillators need to be manufactured in consideration of various elements such as a quality factor, output power, phase noise, etc.

SUMMARY

Example embodiments relate to oscillators, and more particularly, to oscillators having variable frequency and methods of operating the oscillators.

Provided are oscillators capable of increasing a gain of an output signal and operating in a high frequency band by increasing a signal-to-noise ratio, and methods of operating the oscillators.

Additional aspects will be set forth in part in the description which follows and, in part, will be apparent from the description, or may be learned by practice of the presented example embodiments.

According to example embodiments, an oscillator includes an oscillating unit including at least one magnetic layer having a magnetization direction that is variable according to at least one selected from the group consisting of an applied current, an applied voltage and an applied magnetic field. The oscillating unit is configured to generate an oscillation signal having a set frequency. The oscillator further includes an output stage that provides an output signal by differentially amplifying the oscillation signal. The output stage may be integrated on a substrate on which the oscillating unit is integrated.

The output stage may include a first amplifier including a non-inverting amplifier configured to generate a non-inverted amplification signal having a phase that is the same as that of the oscillation signal and an inverting amplifier configured to generate an inverted amplification signal having a phase that is inverted from that of the oscillation signal. The output stage further includes a second amplifier configured to generate first and second output signals by differentially amplifying the non-inverted amplification signal and the inverted amplification signal and providing the first and second output signals as the output signal.

The output stage may further include a bias circuit configured to provide first and second bias signals by adjusting voltage levels of the non-inverted amplification signal and the inverted amplification signal such that the non-inverted amplification signal oscillates with respect to a voltage level and the inverted amplification signal oscillates with respect to the same voltage level, and the second amplifier differentially amplifies the first and second bias signals to generate the first and second output signals.

The non-inverting amplifier may include a first transistor including a gate to which the oscillation signal is applied, a drain that is connected to a first voltage terminal, and a source that is connected to a non-inverted output node configured to output the non-inverted amplification signal. The non-inverting amplifier may include a second transistor that is serially connected to the first transistor via the non-inverted output node. The inverting amplifier may include a third transistor including a gate to which the oscillation signal is applied, a source connected to a second voltage terminal, and a drain connected to an inverted output node configured to output the inverted amplification signal. The inverting amplifier may include a fourth transistor that is serially connected to the third transistor via the inverted output node.

The bias circuit may include a first bias circuit including a first capacitor that is connected between the non-inverted output node and a first bias output node, and a first resistor that is connected to the first bias output node. The first bias circuit is configured to provide the first bias signal at the first bias output node. The bias circuit may include a second bias circuit including a second capacitor that is connected between the inverted output node and a second bias output node, and a second resistor that is connected to the second bias output node. The second bias circuit is configured to provide the second bias signal at the second bias output node.

The second amplifier may include a first transistor including a gate to which the first bias signal is applied and a drain that is connected to a first output node, a second transistor including a gate to which the second bias signal is applied and a drain that is connected to a second output node, a first load that is connected between a power voltage terminal and the first output node, a second load that is connected between the power voltage terminal and the second output node, and a third transistor including a drain that is commonly connected to a source of the first transistor and a source of the second transistor. The third transistor is configured to provide a current to the first and second transistors.

The oscillating unit may include a current source configured to provide the applied current, and at least one oscillation device configured to generate the oscillation signal based on the applied current.

The at least one oscillation device may include a first magnetic layer, a second magnetic layer having a pinned magnetization direction, and a non-magnetic layer disposed between the first magnetic layer and the second magnetic layer. The first magnetic layer is the at least one magnetic layer having the magnetization direction that is variable according to the at least one selected from the group consisting of the applied current, the applied voltage and the applied magnetic field.

A magnetic moment of the first magnetic layer may perform a precession according to the at least one selected from the group consisting of the applied current, the applied voltage and the applied magnetic field such that the at least one oscillation device generates the oscillation signal as a resistance of the at least one oscillation device is periodically changed.

The second magnetic layer may include a first pinned layer that is disposed adjacent to the non-magnetic layer and has a first magnetization direction, a separation layer that is disposed adjacent to the first pinned layer, and a second pinned layer that is disposed adjacent to the separation layer and has a second magnetization direction that is opposite to the first magnetization direction.

The second magnetic layer may include a pinned layer that is disposed adjacent to the non-magnetic layer, and an anti-ferromagnetic layer that is disposed adjacent to the pinned layer, wherein a magnetization direction of the pinned layer is pinned in a direction corresponding to a magnetic moment of an uppermost portion of the anti-ferromagnetic layer.

According to example embodiments, an oscillator includes an oscillating unit including at least one magnetic layer having a magnetization direction that is variable according to at least one selected from the group consisting of an applied current, an applied voltage and an applied magnetic field. The oscillating unit is configured to generate an oscillation signal having a set frequency. The oscillator further includes an output stage that provides an output signal by amplifying the oscillation signal. The output stage may include a first amplifier configured to amplify the oscillation signal to provide an amplification signal, and a second amplifier configured to amplify the amplified oscillation signal to provide the output signal. The output stage may be integrated on a substrate on which the oscillating unit is integrated.

The output stage may further include a bias circuit that adjusts a voltage level of the amplification signal to provide a bias signal, and the second amplifier may amplify the bias signal to provide the output signal. The bias signal may be the amplified oscillation signal.

The second amplifier may include a first n-type metal oxide semiconductor (NMOS) transistor including a gate to which the bias signal is applied and a drain that is connected to an output node to which the output signal is provided, a second NMOS transistor including a drain that is connected to a source of the first NMOS transistor and a source that is connected to a ground voltage terminal, and a resistor that is connected between a power voltage terminal and the output node.

The first amplifier may provide a non-inverted amplification signal having a phase that is the same as that of the oscillation signal, as the amplification signal. The first amplifier may provide an inverted amplification signal having a phase that is inverted from that of the oscillation signal, as the amplification signal.

Example embodiments provide a method of operating an oscillator including an oscillating unit including at least one magnetic layer having a magnetization direction that is variable according to at least one selected from the group consisting of an applied current, an applied voltage and an applied magnetic field, and an output stage. The method includes applying a current to the oscillating unit in a set direction, generating an oscillation signal having a set frequency, using a precession of a magnetic moment of the at least one magnetic layer that occurs according to the direction of the current, and providing an output signal using the output stage by differentially amplifying the oscillation signal. The output stage may be integrated on a substrate on which the oscillating unit is integrated.

Providing the output signal may include generating a non-inverted amplification signal having a phase that is the same as that of the oscillation signal and an inverted amplification signal having a phase that is inverted from that of the oscillation signal, and generating first and second output signals by differentially amplifying the non-inverted amplification signal and the inverted amplification signal, and providing the first and second output signals as the output signal.

Providing the output signal may further include providing first and second bias signals by adjusting voltage levels of the non-inverted amplification signal and the inverted amplification signal such that the non-inverted amplification signal oscillates with respect to a voltage level and the inverted amplification signal oscillates with respect to the same voltage level. When providing the first and second output signals as the output signal, the first and second bias signals may be differentially amplified to generate the first and second output signals.

Gains of the non-inverted amplification signal and the inverted amplification signal with respect to the oscillation signal may be substantially near (or about) 1, and gains of the first and second output signals with respect to the oscillation signal may be greater than 1.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
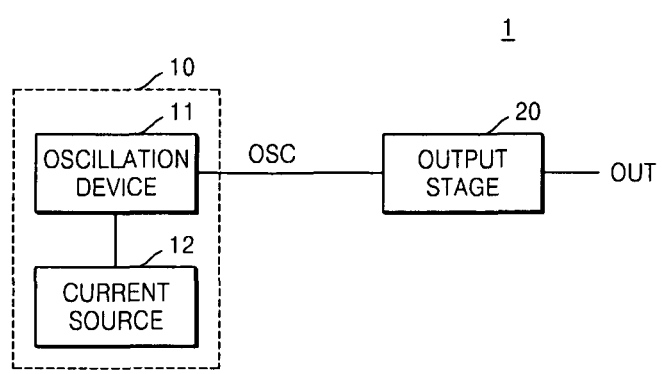
FIG. 1 is a schematic block diagram of an oscillator according to example embodiments.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In order to more specifically describe example embodiments, various aspects will be described in detail with reference to the attached drawings. However, the present invention is not limited to example embodiments described.

Example embodiments relate to oscillators, and more particularly, to oscillators having variable frequency and a method of operating the oscillators.

FIG. 1 is a schematic block diagram of an oscillator according to example embodiments.

Referring to FIG. 1, an oscillator 1 includes an oscillating unit 10 and an output stage 20. According to example embodiments, the oscillating unit 10 and the output stage 20 may be integrated on the same substrate. Accordingly, the oscillating unit 10 and the output stage 20 may be formed on the same substrate using a complementary metal oxide semiconductor (CMOS) manufacturing process, and therefore, manufacturing of the oscillator 1 may be simplified. Also, a substantially short wiring may be formed between the oscillating unit 10 and the output stage 20, thereby reducing signal interference between the oscillating unit 10 and the output stage 20 and noise in an output signal output from the output stage 20.

The oscillating unit 10 may include at least one oscillation device 11 and a current source 12. In detail, the oscillating unit 10 may include at least one magnetic layer having a magnetization direction that varies according to at least one selected from the group consisting of an applied current, an applied voltage and an applied magnetic field. The oscillating unit 10 may generate an oscillation signal OSC having a set frequency. Hereinafter, the structure and operation of the oscillating unit 10 will be described in detail with reference to FIGS. 2 and 3.

The output stage 20 may amplify the oscillation signal OSC generated in the oscillating unit 10 to a set (or threshold) level to generate an output signal OUT. Thus, a gain of the output signal OUT with respect to the oscillation signal OSC may have a value greater than 1. For example, the output stage 20 may differentially amplify the oscillation signal OSC by using a differential signaling method. Alternatively, the output stage 20 may amplify the oscillation signal OSC by using a single ended method.

Figure 2:
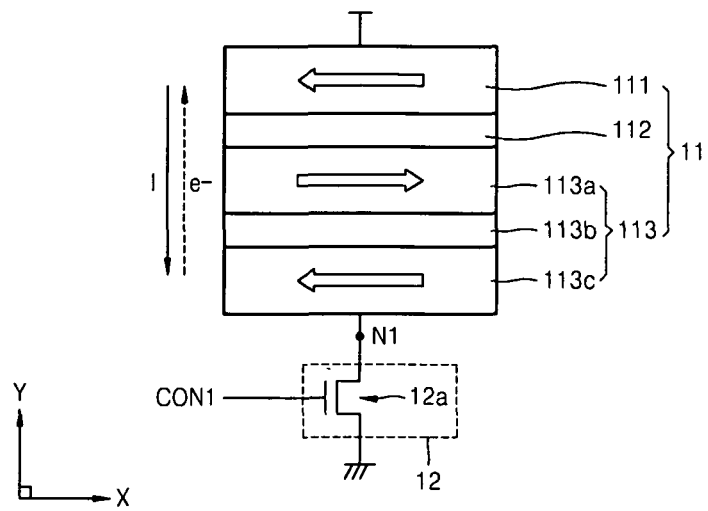
FIG. 2 illustrates an oscillating unit included in the oscillator of FIG. 1, according to example embodiments.

FIG. 2 illustrates an oscillating unit included in the oscillator of FIG. 1, according to example embodiments.

Referring to FIG. 2, an oscillating unit 10A may include at least one oscillation device 11 and a current source 12. The oscillating unit 10A illustrated in FIG. 2 includes one oscillation device 11, but example embodiments are not limited thereto. For example, the oscillating unit 10A may include a plurality of oscillation devices connected to one another in series, in parallel, or in a serial-parallel manner.

The at least one oscillation device 11 may be formed of a spin valve structure including a first magnetic layer 111, a non-magnetic layer 112 and a second magnetic layer 113. The first magnetic layer 111 of the oscillation device 11 may be disposed above the second magnetic layer 113. Thus, the oscillation device 11 may have a structure in which the second magnetic layer 113, the non-magnetic layer 112 and the first magnetic layer 111 are sequentially stacked.

Although not shown in FIG. 2, electrode layers may be disposed on the first magnetic layer 111 and/or under the second magnetic layer 113. However, when an electric resistance of the first magnetic layer 111 or the second magnetic layer 113 is sufficiently low, the first magnetic layer 111 or the second magnetic layer 113 itself may be used as an electrode. Thus, there may be no need to dispose an additional electrode layer on the first magnetic layer 111 or the second magnetic layer 113.

The first magnetic layer 111 may be a free layer having a magnetization direction varies according to at least one selected from the group consisting of an applied current, an applied voltage and an applied magnetic field. In example embodiments, the oscillation device 11 includes only one first magnetic layer 111, but example embodiments are not limited thereto. Alternatively, the oscillation device 11 may include at least two first magnetic layers 111. At this time, a separation layer (e.g., an insulating layer or a conductive layer) may be disposed between the two first magnetic layers 111.

The first magnetic layer 111 may have perpendicular magnetic anisotropy or in-plane magnetic anisotropy. When the first magnetic layer 111 has perpendicular magnetic anisotropy, the first magnetic layer 111 may be an alloy layer formed of an alloy including cobalt (Co) (e.g., CoPt or CoCrPt), or may be a multi-layer in which a first layer including at least one selected from the group consisting of Co and an alloy including Co, and a second layer including at least one selected from the group consisting of platinum (Pt), nickel (Ni), and palladium (Pd) are alternately stacked. When the first magnetic layer 111 has in-plane magnetic anisotropy, the first magnetic layer 111 may be a material layer including at least one selected from the group consisting of Co, Ni, and iron (Fe) (e.g., CoFeB or NiFe). However, the configuration of the first magnetic layer 111 is not limited to the above-described examples. In general, a material generally used for a free layer in a magnetic device may be used as a material of the first magnetic layer 111.

The non-magnetic layer 112 may be disposed between the first magnetic layer 111 and the second magnetic layer 113. The non-magnetic layer 112 may be configured as a conductive layer or an insulating layer. When the non-magnetic layer 112 is configured as a conductive layer, the non-magnetic layer 112 may be a layer including at least one selected from the group consisting of copper (Cu), aluminum (Al), gold (Au), and silver (Ag), and a compound thereof. Here, the oscillation device 11 may have a giant magnetoresistance (GMR) structure. When the non-magnetic layer 112 is configured as an insulating layer, the non-magnetic layer 112 may be a layer including an oxide (e.g., MgO or $AlO_x$). Here, the oscillation device 11 may have a tunneling magnetoresistance (TMR) structure.

The second magnetic layer 113 may be a pinned layer having a pinned magnetization direction. In example embodiments, the second magnetic layer 113 may have a structure in which a first pinned layer 113a, a separation layer 113b and a second pinned layer 113c are stacked. In this case, exchange coupling may occur between the first pinned layer 113a and the second pinned layer 113c. Thus, the first and second pinned layers 113a and 113c may respectively have magnetization directions pinned in opposite directions. In example embodiments, the second pinned layer 113c may have a magnetization direction pinned in a negative x-axis direction. Thus, the first pinned layer 113a may have a magnetization direction pinned in a positive x-axis direction.

For example, the first and second pinned layers 113a and 113c may be formed of a ferromagnetic material including at least one selected from the group consisting of Co, Fe and Ni. The separation layer 113b may be formed of a conductive material (e.g., ruthenium (Ru) or chromium (Cr)). In example embodiments, the first and second pinned layers 113a and 113c may include Co, and the separation layer 113b may include Ru. Thus, the second magnetic layer 113 may have a stacked structure of Co/Ru/Co.

The current source 12 may include at least one driving transistor 12a. The driving transistor 12a may be an n-type metal oxide semiconductor (NMOS) transistor having a drain connected to the oscillation device 11, a gate to which a control signal CON1 configured to control driving of the oscillation device 11 is applied, and a source connected to a ground terminal. When the control signal CON1 is activated, the driving transistor 12a may be turned on and thus provide the oscillation device 11 with a current. In example embodiments, the drain of the driving transistor 12a may be connected to an oscillation output node N1 of the oscillation device 11 (i.e., the drain of the driving transistor 12a may be connected to the second magnetic layer 113).

Hereinafter, operations of the oscillation device according to example embodiments will be described in detail. In example embodiments, the at least one oscillation device 11 may be connected between a power voltage terminal and the oscillation output node N1. In detail, the first magnetic layer 111 may be connected to the power voltage terminal to apply a power voltage to the first magnetic layer 111. The second pinned layer 113c of the second magnetic layer 113 may be connected to the oscillation output node N1. Thus, a current (I) may be applied in a negative y-axis direction (i.e., in a direction from the first magnetic layer 111 to the second magnetic layer 113). An electron e− may move in a positive y-axis direction (i.e., in a direction from the second magnetic layer 113 to the first magnetic layer 111).

The electron e– having passed through the second magnetic layer 113 may have a spin direction that is the same as that of the first pinned layer 113a (i.e., a spin direction in the positive x-axis direction). Thus, a spin torque in the positive x-axis direction may be applied to the first magnetic layer 111. A magnetic moment of the first magnetic layer 111 may be perturbed due to the spin torque. Even when an additional external magnetic field is not applied to the oscillation device 11, a stray field in the negative x-axis direction may be applied to the first magnetic layer 111 due to the first pinned layer 113a. Thus, a restoring force may be applied to the magnetic moment of the first magnetic layer 111 due to the stray field.

As such, the spin torque in the positive x-axis direction and the stray field in the negative x-axis direction may be applied to the first magnetic layer 111. A force due to the spin torque, which perturbs the magnetic moment of the first magnetic layer 111, and a force due to the stray field, which restores the magnetic moment of the first magnetic layer 111, are balanced. Thus, an axis of the magnetic moment of the first magnetic layer 111 may rotate while tracing a specific track. Here, an axis direction of the magnetic moment may be regarded as a magnetization direction, and a precession of the magnetic moment may be regarded as a rotation of the magnetization direction.

An angle formed by magnetization directions of the first magnetic layer 111 and the second magnetic layer 113 may be periodically changed according to the precession of the magnetic moment. Thus, an electric resistance of the oscillation device 11 may be periodically changed. As a result, the oscillation device 11 may generate an oscillation signal OSC having a set (or threshold) frequency. The oscillation device 11 may be manufactured small compared to conventional LC oscillators and conventional film bulk acoustic resonator (FBAR) oscillators and may have a higher quality factor and variable frequency.

Figure 3:
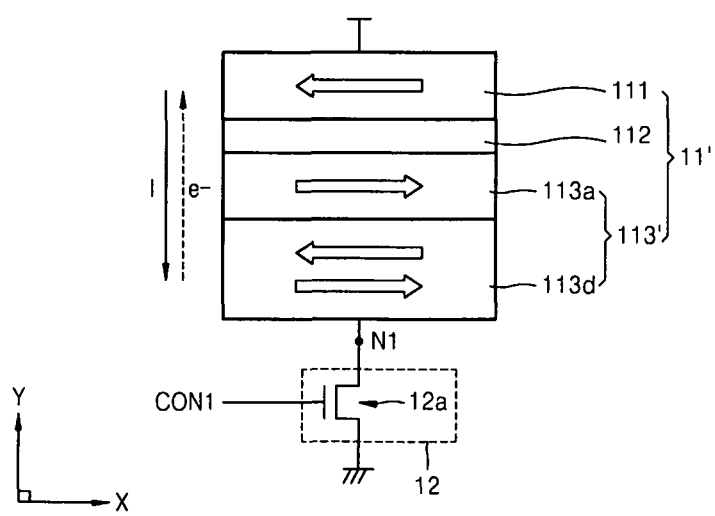
FIG. 3 illustrates an oscillating unit included in the oscillator of FIG. 1, according to example embodiments.

FIG. 3 illustrates an oscillating unit included in the oscillator of FIG. 1 according to example embodiments.

Referring to FIG. 3, an oscillating unit 10B may include at least one oscillation device 11' and a current source 12. The oscillating unit 10B is a modification example of the oscillating unit 10A of FIG. 2. Hereinafter, descriptions will focus on differences from the oscillating unit 10A. In detail, the oscillating unit 10B is different from the oscillating unit 10A in terms of the structure of the oscillation device 11'. Accordingly, detailed descriptions of the current source 12 will be omitted.

The oscillation device 11' may include a first magnetic layer 111, a non-magnetic layer 112 and a second magnetic layer 113'. The second magnetic layer 113' may include a ferromagnetic layer 113a and an anti-ferromagnetic layer 113d. In this regard, the ferromagnetic layer 113a may be configured substantially in the same way as the first magnetic layer 113a of FIG. 1. The anti-ferromagnetic layer 113d may include a manganese-based material (e.g., InMn or FeMn). However, the configuration of the anti-ferromagnetic layer 113d is not limited thereto, and thus any material having an anti-ferromagnetic characteristic may be used as a material of the anti-ferromagnetic layer 113d.

In the anti-ferromagnetic layer 113d, magnetic moments of atoms are regularly arranged in forward and reverse directions. A magnetization direction of the ferromagnetic layer 113a may be pinned in a direction corresponding to a magnetic moment of an uppermost portion of the anti-ferromagnetic layer 113d. In example embodiments, the magnetic moment of the uppermost portion of the anti-ferromagnetic layer 113d is in the negative x-axis direction, and a magnetization direction of the ferromagnetic layer 113a may be pinned in the positive x-axis direction.

Figure 4:
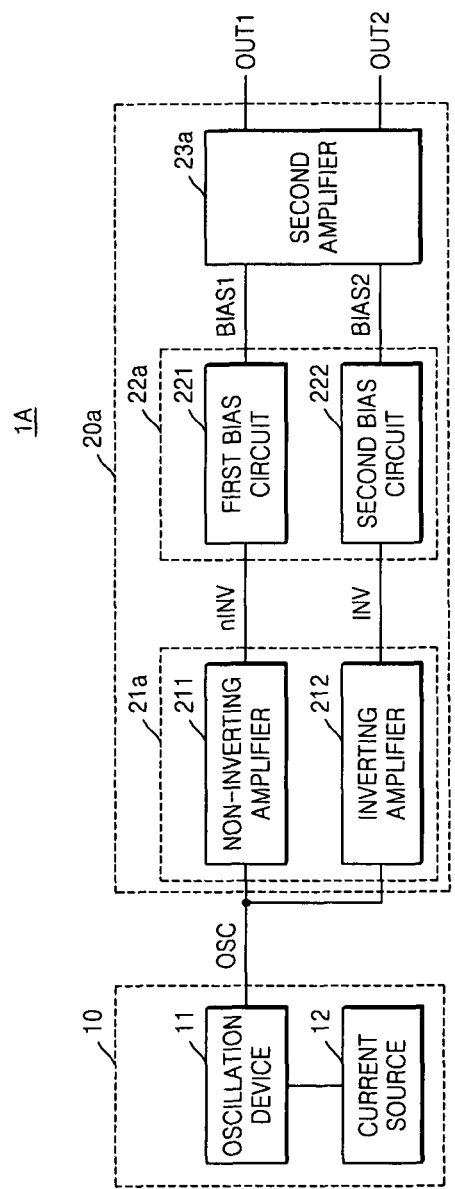
FIG. 4 is a detailed block diagram of the oscillator of FIG. 1 according to example embodiments.

FIG. 4 is a detailed block diagram of an example of the oscillator of FIG. 1 according to example embodiments.

Referring to FIG. 4, an oscillator 1A may include an oscillating unit 10 and an output stage 20A. The output stage 20A may include a first amplifier 21a, a bias circuit 22a, and a second amplifier 23a. The oscillating unit 10 may be formed as described with reference to FIGS. 1 through 3. Thus, descriptions thereof will be omitted.

The first amplifier 21a may include a non-inverting amplifier 211 and an inverting amplifier 212. The first amplifier 21a may generate differential inputs having opposite polarities by receiving an oscillation signal OSC generated in the oscillating unit 10. In detail, the non-inverting amplifier 211 may generate a non-inverted amplification signal nINV having the same phase as the oscillation signal OSC, and the inverting amplifier 212 may generate an inverted amplification signal INV having an inverted phase with respect to the oscillation signal OSC. The non-inverting amplifier 211 and the inverting amplifier 212 may operate as source followers, and gains of the non-inverting amplifier 211 and the inverting amplifier 212 may be near (or about) 1.

A bias circuit 22a may include a first bias circuit 221 and a second bias circuit 222 and adjust voltage levels of the non-inverted amplification signal nINV and the inverted amplification signal INV such that the non-inverted amplification signal nINV and the inverted amplification signal INV oscillate based on the same voltage level. In detail, the first bias circuit 221 may adjust the voltage level of the non-inverted amplification signal nINV to generate a first bias signal BIAS1, and the second bias circuit 222 may adjust the voltage level of the inverted amplification signal INV to generate a second bias signal BIAS2.

The second amplifier 23a may receive the first and second bias signals BIAS1 and BIAS2. The second amplifier 23a may generate first and second output signals OUT1 and OUT2 by differentially amplifying the first and second bias signals BIAS1 and BIAS2 to a set (or threshold) level. Thus, by differentially amplifying the first and second bias signals BIAS1 and BIAS2, the second amplifier 23a may increase gains of the first and second output signals OUT1 and OUT2, and increase a signal-to-noise ratio so that the oscillator 1A may be able to operate in a high frequency band. Also, by differentially amplifying the first and second bias signals BIAS1 and BIAS2, the second amplifier 23a may reduce a measurement error compared to when using a single ended output, and increase a common-mode rejection ratio (CMRR).

Figure 5:
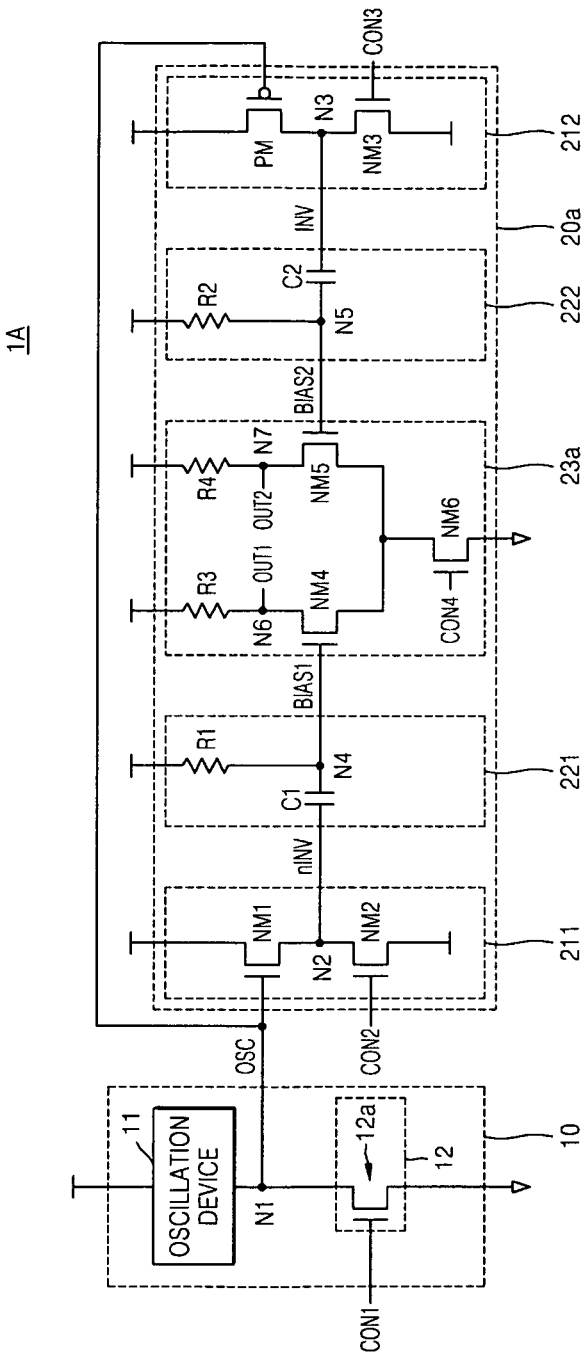
FIG. 5 is a circuit diagram illustrating the oscillator of FIG. 4 according to example embodiments.
Figure 6:
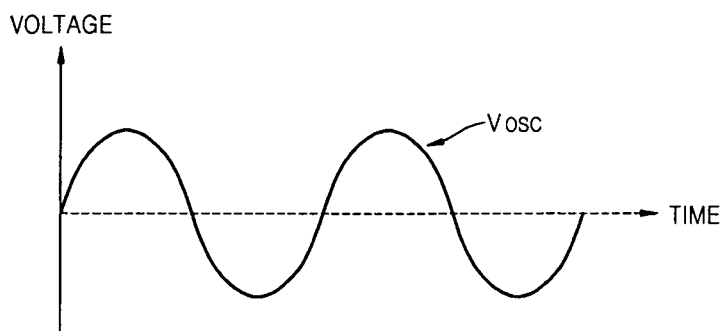
FIG. 6 is a timing diagram illustrating an oscillation signal output from an oscillating unit included in the oscillator of FIG. 5.
Figure 7A:
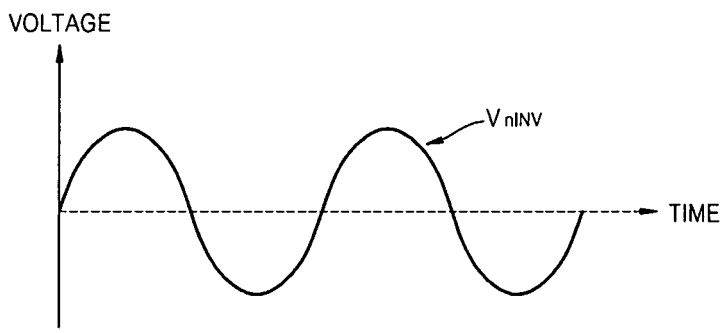
FIGS. 7A and 7B are timing diagrams of a non-inverted amplification signal and an inverted amplification signal respectively output from a non-inverting amplifier and an inverting amplifier included in the oscillator of FIG. 5.
Figure 7B:
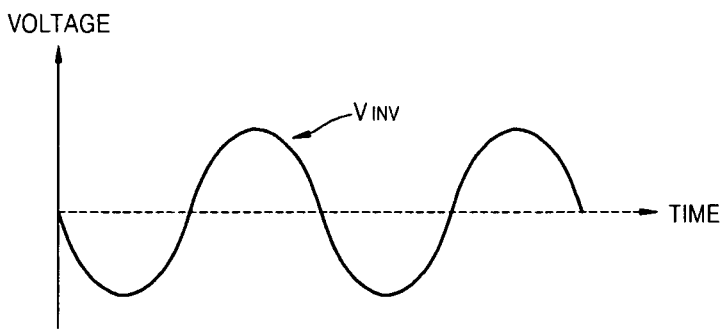
Figure 8A:
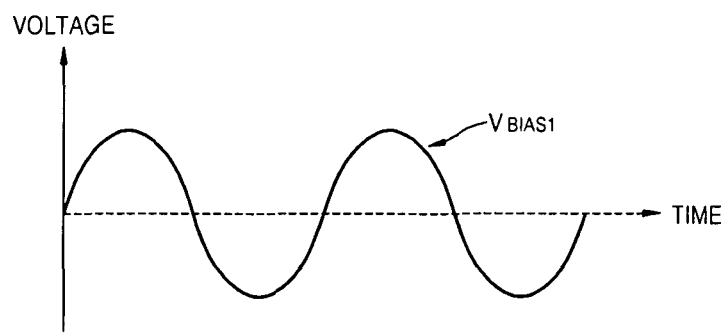
FIGS. 8A and 8B are timing diagrams of first and second bias signals respectively output from first and second bias circuits included in the oscillator of FIG. 5.
Figure 8B:
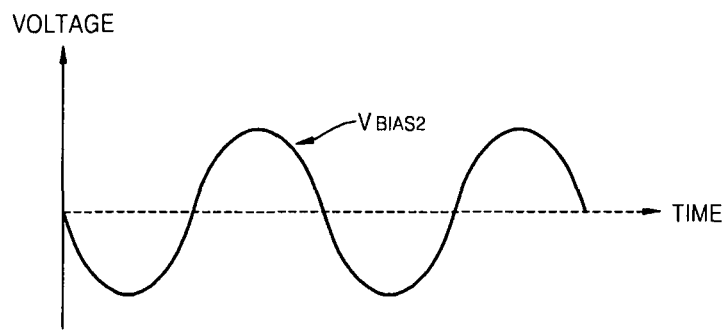
Figure 9A:
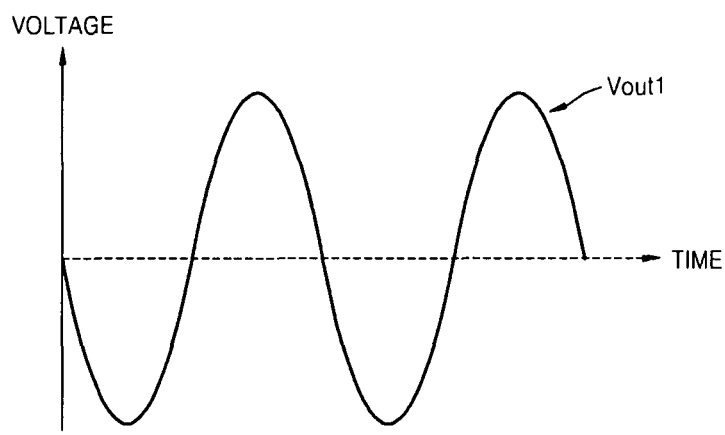
FIGS. 9A and 9B are timing diagrams illustrating first and second output signals output from a second amplifier included in the oscillator of FIG. 5.
Figure 9B:
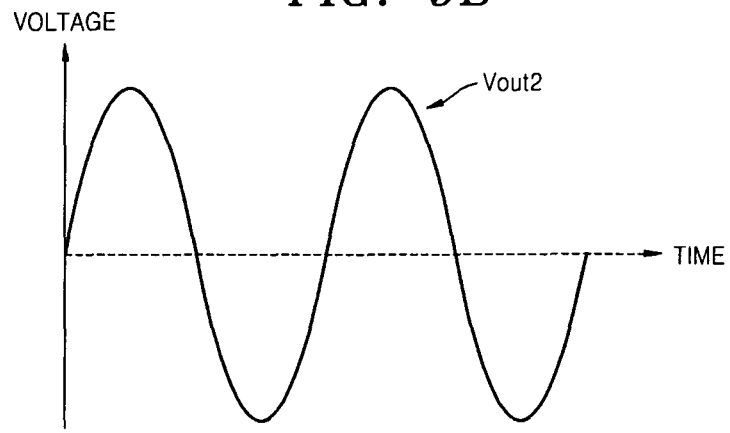
Figure 10:
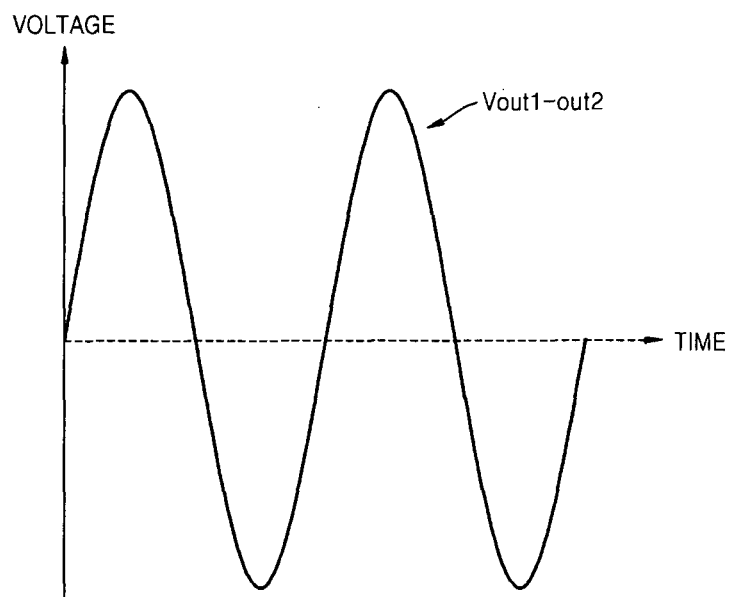
FIG. 10 is a timing diagram illustrating a difference between the first output signal and the second output signal output from the second amplifier included in the oscillator of FIG. 5.

FIG. 5 is a circuit diagram illustrating the oscillator of FIG. 4, according to example embodiments. FIG. 6 is a timing diagram illustrating an oscillation signal output from an oscillating unit included in the oscillator of FIG. 5. FIGS. 7A and 7B are timing diagrams of a non-inverted amplification signal and an inverted amplification signal respectively output from a non-inverting amplifier and an inverting amplifier included in the oscillator of FIG. 5. FIGS. 8A and 8B are timing diagrams of first and second bias signals respectively output from first and second bias circuits included in the oscillator of FIG. 5. FIGS. 9A and 9B are timing diagrams illustrating first and second output signals output from a second amplifier included in the oscillator of FIG. 5. FIG. 10 is a timing diagram illustrating a difference between the first output signal and the second output signal output from the second amplifier included in the oscillator of FIG. 5.

Referring to FIGS. 5 through 10, an oscillating unit 10 in the oscillator 1A may include at least one oscillation device 11 and a current source 12. The at least one oscillation device 11 may be connected between a power voltage terminal and an oscillation output node N1, and the current source 12 may be connected between the oscillation output node N1 and a ground voltage terminal. For example, a voltage level of the power voltage terminal may be about 1.2 V, and a voltage level of a control signal CON1 applied to the current source 12 may be about 0.55 V. An oscillation signal OSC in the oscillation output node N1 may oscillate as illustrated in FIG. 6, for example, with respect to about 0.48 V.

An output stage 20A included in the oscillator 1A may include a non-inverting amplifier 211, an inverting amplifier 212, a first bias circuit 221, a second bias circuit 222, and a second amplifier 23a. Hereinafter, elements included in the output stage 20A will be described in detail.

The non-inverting amplifier 211 may include first and second NMOS transistors NM1 and NM2 that are serially connected to each other. The first NMOS transistor NM1 may include a gate connected to the oscillation output node N1 of the oscillating unit 10, a drain connected to a first voltage terminal, and a source connected to a non-inverted output node N2. For example, a voltage level of the first voltage terminal may be about 1.0 V. The second NMOS transistor NM2 may include a gate to which a control signal CON2 is applied, a drain connected to the non-inverted output node N2, and a source connected to a second voltage terminal. For example, a voltage level of the second voltage terminal may be about −1.0 V, and a voltage level of the control signal CON2 may be about 0.0 V.

The non-inverting amplifier 211 may receive the oscillation signal OSC from the oscillation output node N1 of the oscillating unit 10 and output a non-inverted amplification signal nINV having the same phase as the oscillation signal OSC, at the non-inverted output node N2. The non-inverted amplification signal nINV may oscillate as illustrated in FIG. 7A, for example, with respect to about −0.47 V.

The inverting amplifier 212 may include a p-type MOS (PMOS) transistor PM and a third NMOS transistor NM3 that are serially connected to each other. The PMOS transistor PM may include a gate connected to the oscillation output node N1 of the oscillating unit 10, a source connected to a third voltage terminal, and a drain connected to an inverted output node N3. For example, a voltage level of the third voltage terminal may be about 1.8 V. The third NMOS transistor NM3 may include a gate to which a control signal CON3 is applied, a drain connected to the inverted output node N3, and a source connected to a fourth voltage terminal. For example, the fourth voltage terminal may be a ground terminal, and a voltage level of the control signal CON3 may be about 1.0 V.

The inverting amplifier 212 may receive the oscillation signal OSC from the oscillation output node N1 of the oscillating unit 10 and output an inverted amplification signal INV having an inverted phase with respect to the oscillation signal OSC, at the inverted output node N3. The inverted amplification signal INV may oscillate as illustrated in FIG. 7B, for example, with respect to about 0.86 V.

The first bias circuit 221 may include a first capacitor C1 and a first resistor R1, and the first capacitor C1 and the first resistor R1 may be commonly connected to a first bias output node N4. In detail, the first capacitor C1 may be connected between the non-inverted output node N2 and the first bias output node N4 to remove a direct current component from the non-inverted amplification signal nINV. The first resistor R1 may be connected between a fifth voltage terminal and the first bias output node N4 to supply a first bias signal BIAS1 that oscillates with respect to a set voltage level.

The first bias circuit 221 may receive the non-inverted amplification signal nINV from the non-inverted output node N2 and output the first bias signal BIAS1, wherein the first bias circuit 221 may output the first bias signal BIAS1 by adjusting a standard voltage level of the non-inverted amplification signal nINV, at the first bias output node N4. For example, the first bias signal BIAS1 may oscillate as illustrated in FIG. 8A.

The second bias circuit 222 may include a second capacitor C2 and a second resistor R2, and the second capacitor C2 and the second resistor R2 may be commonly connected to a second bias output node N5. In detail, the second capacitor C2 may be connected between the inverted output node N3 and the second bias output node N5 to remove a direct current component from the inverted amplification signal INV. The second resistor R2 is connected between a sixth voltage terminal and the second bias output node N5 to supply a second bias signal BIAS2 that oscillates with respect to a set voltage level. The first and second resistors R1 and R2 may have identical resistance values, and the fifth and sixth voltage terminals may have identical voltage levels.

The second bias circuit 222 may receive the inverted amplification signal INV from the inverted output node N3 and output the second bias signal BIAS2, wherein the second bias circuit 221 may output the second bias signal BIAS2 by adjusting a standard voltage level of the inverted amplification signal INV, at the second bias output node N5. For example, the second bias signal BIAS2 may oscillate as illustrated in FIG. 8B.

The second amplifier 23a may include third and fourth resistances R3 and R4 and fourth through sixth NMOS transistors NM4, NM5 and NM6, and may differentially amplify the first and second bias signals BIAS1 and BIAS2 to supply first and second output signals OUT1 and OUT2. In detail, the fourth NMOS transistor NM4 may include a gate that is connected to the first bias output node N4 and to which the first bias signal BIAS1 is applied and a drain that is connected to a first output node N6. The fifth NMOS transistor NM5 may include a gate that is connected to the second bias output node N5 and to which the second bias signal BIAS2 is applied and a drain that is connected to a second output node N7. The sixth NMOS transistor NM6 may include a drain that is commonly connected to a source of the fourth NMOS transistor NM4 and a source of the fifth NMOS transistor NM5, a gate to which a control signal CON4 is applied, and a source that is connected to a ground terminal, and may supply a current to the fourth and fifth NMOS transistors NM4 and NM5. The third resistor R3 may be connected between a seventh voltage terminal and the first output node N6, and the fourth resistor R4 may be connected between an eighth voltage terminal and the second output node N7. Voltage levels of the seventh and eighth voltage terminals may be the same as a level of a power voltage.

The second amplifier 23a may amplify the first bias signal BIAS1 to a set level to output the first output signal OUT1 having an inverted phase with respect to the first bias signal BIAS1, at the first output node N6. The first output signal OUT1 may oscillate as illustrated in FIG. 9A. Also, the second amplifier 23a may amplify the second bias signal BIAS2 to a set level to output the second output signal OUT2 having an inverted phase with respect to the second bias signal BIAS2, at the second output node N7. The second output signal OUT2 may oscillate as illustrated in FIG. 9B.

An output voltage corresponding to a difference between the first output signal OUT1 and the second output signal OUT2 is as illustrated in FIG. 10. Compared to the oscillation signal OSC output from the oscillating unit 10, a gain of the output voltage has greatly increased.

Figure 11:
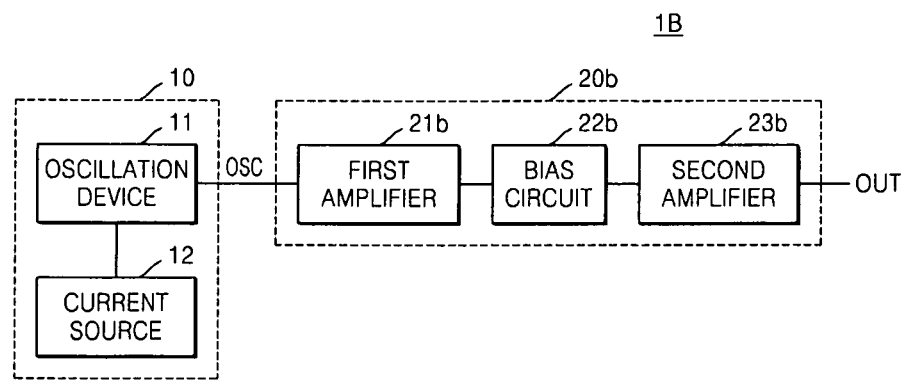
FIG. 11 is a detailed block diagram of the oscillator of FIG. 1 according to example embodiments.

FIG. 11 is a detailed block diagram of an example of the oscillator of FIG. 1 according to example embodiments.

Referring to FIG. 11, an oscillator 1B may include an oscillating unit 10 and an output stage 20b. The output stage 20b may include a first amplifier 21b, a bias circuit 22b and a second amplifier 23b. The oscillating unit 10 may be formed as described with reference to FIGS. 1 through 3. Thus, descriptions thereof will be omitted.

The first amplifier 21b may receive an oscillation signal OSC generated in the oscillating unit 10 to generate an amplification signal. For example, the amplification signal may have an inverted phase with respect to the oscillation signal OCS. Alternatively, the amplification signal may have a non-inverted phase with respect to the oscillation signal OSC. The first amplifier 21b may operate as a source follower, and a gain of the first amplifier 21b may be near (or about) 1. Alternatively, the output stage 20b may include only the first amplifier 21b.

The bias circuit 22b may adjust a voltage level of the amplification signal. In detail, the bias circuit 22b may generate a bias signal by adjusting the voltage level of the amplification signal.

The second amplifier 23b may receive the bias signal and amplify the received bias signal to a set level to generate an output signal OUT. According to example embodiments, the second amplifier 23b may be formed using NMOS transistors. As such, the second amplifier 23b may operate at a high speed, thereby increasing an operating speed of the oscillator 1B.

Figure 12:
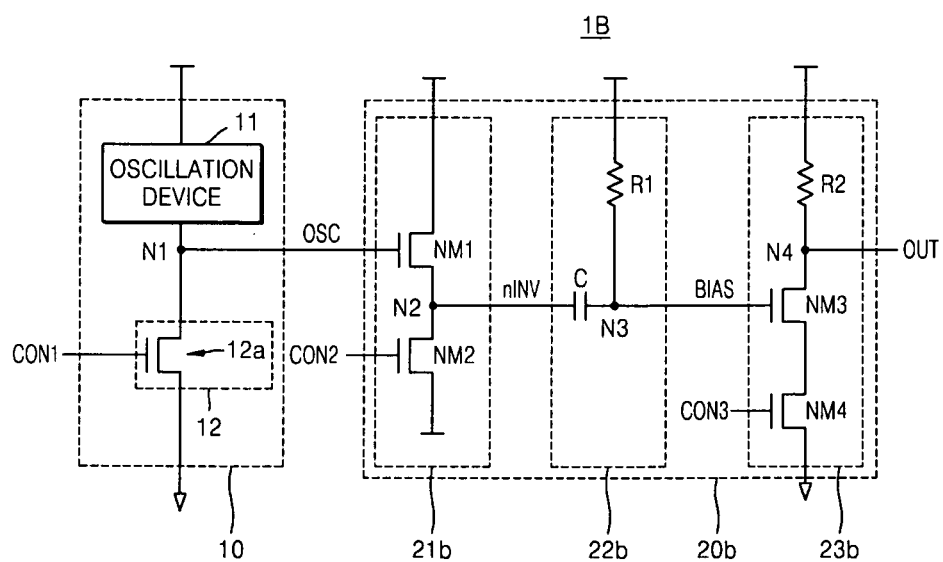
FIG. 12 is a circuit diagram illustrating the oscillator of FIG. 11 according to example embodiments.
Figure 13:
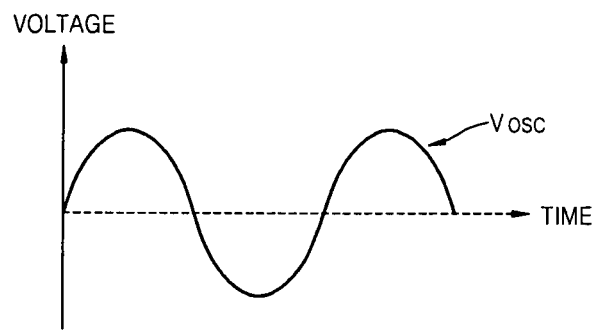
FIG. 13 is a timing diagram illustrating an oscillation signal output from an oscillating unit included in the oscillator of FIG. 11.
Figure 14:
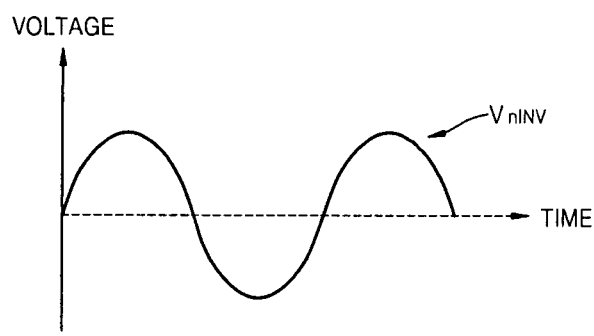
FIG. 14 is a timing diagram illustrating an amplification signal output from a first amplifier included in the oscillator of FIG. 11.
Figure 15:
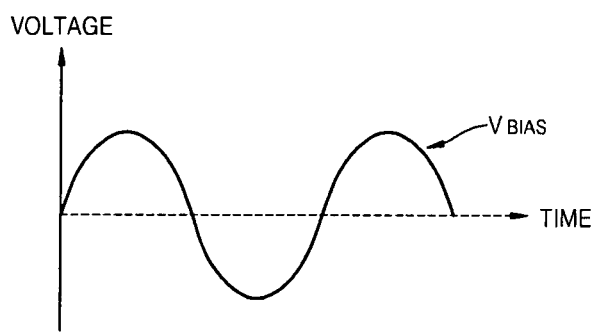
FIG. 15 is a timing diagram illustrating a bias signal output from a bias circuit included in the oscillator of FIG. 11.
Figure 16:
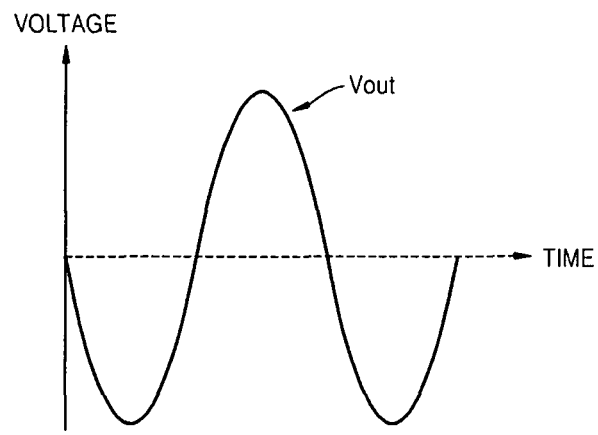
FIG. 16 is a timing diagram illustrating an output signal output from a second amplifier included in the oscillator of FIG. 11.

FIG. 12 is a circuit diagram illustrating the oscillator of FIG. 11 according to example embodiments. FIG. 13 is a timing diagram illustrating an oscillation signal output from an oscillating unit included in the oscillator of FIG. 11. FIG. 14 is a timing diagram illustrating an amplification signal output from a first amplifier included in the oscillator of FIG. 11. FIG. 15 is a timing diagram illustrating a bias signal output from a bias circuit included in the oscillator of FIG. 11. FIG. 16 is a timing diagram illustrating an output signal output from a second amplifier included in the oscillator of FIG. 11.

Referring to FIGS. 12 through 16, an oscillating unit 10 in an oscillator 1B may include at least one oscillation device 11 and a current source 12. The at least one oscillation device 11 may be connected between a power voltage terminal and an oscillation output node N1. The current source 12 may be connected between the oscillation output node N1 and a ground voltage terminal. An oscillation signal OSC in the oscillation output node N1 may oscillate as illustrated in FIG. 13.

A first amplifier 21b of an output stage 20B included in the oscillator 1A may include first and second NMOS transistors NM1 and NM2 that are serially connected to each other. The first NMOS transistor NM1 may include a gate that is connected to the oscillation output node N1 of the oscillating unit 10 and to which the oscillation signal OSC is applied, a drain connected to a first voltage terminal, and a source connected to an amplification node N2. For example, a voltage level of the first voltage terminal may be about 1.0 V. The second NMOS transistor NM2 may include a gate to which a control signal CON2 is applied, a drain connected to the amplification node N2, and a source connected to a second voltage terminal. For example, a voltage level of the second voltage terminal may be about −1.0 V, and a voltage level of the control signal CON2 may be about 0.0 V.

The first amplifier 21b may receive the oscillation signal OSC from the oscillation output node N1 of the oscillating unit 10 and output a non-inverted amplification signal nINV having the same phase as the oscillation signal OSC, at the amplification node N2. The non-inverted amplification signal nINV may oscillate as illustrated in FIG. 14, for example, with respect to about −0.47 V.

The bias circuit 22b may include a capacitor C and a first resistor R1, and the capacitor C and the first resistor R1 may be commonly connected to a bias output node N3. In detail, the capacitor C may be connected between the amplification node N2 and the bias output node N3 to remove a direct current component from the non-inverted amplification signal nINV. The first resistor R1 may be connected between a third voltage terminal and the bias output node N3 to supply a bias signal BIAS oscillating with respect to a set (or threshold) voltage level.

The bias circuit 22b may receive the non-inverted amplification signal nINV from the non-inverted output node N2 and output the bias signal BIAS, wherein the bias circuit 22b may output the bias signal BIAS by adjusting a standard voltage level of the non-inverted amplification signal nINV, at the bias output node N3. For example, the bias signal BIAS may oscillate as illustrated in FIG. 15.

The second amplifier 23b may include a second resistor R2 and third and fourth NMOS transistors NM3 and NM4, and may amplify the bias signal BIAS to supply an output signal OUT. In detail, the third NMOS transistor NM3 may include a gate that is connected to the bias output node N3 and to which the bias signal BIAS is applied and a drain that is connected to an output node N4. The fourth NMOS transistor NM4 may include a drain that is connected to a source of the third NMOS transistor NM3, a gate to which a control signal CON3 is applied, and a source that is connected to a ground terminal. The fourth NMOS transistor NM4 may supply a current to the third NMOS transistor NM3. The second resistor R2 may be connected between a fourth voltage terminal and the output node N4. A voltage level of the fourth voltage terminal may be the same as a level of a power voltage.

The second amplifier 23b may amplify the bias signal BIAS to a set level to output the output signal OUT having an inverted phase with respect to the bias signal BIAS, at the output node N4. The output signal OUT may oscillate as illustrated in FIG. 16.

Figure 17:
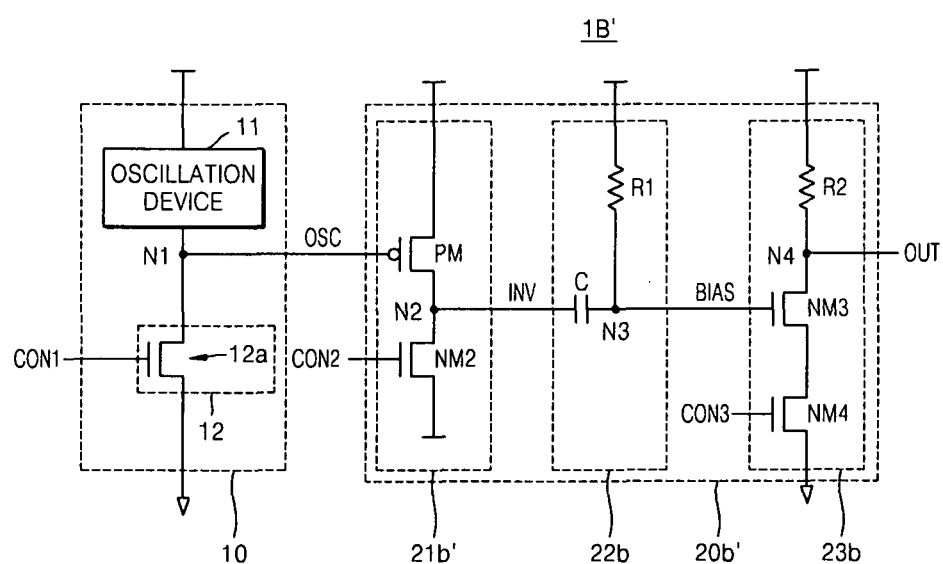
FIG. 17 is a circuit diagram illustrating the oscillator of FIG. 1 according to example embodiments.
Figure 18:
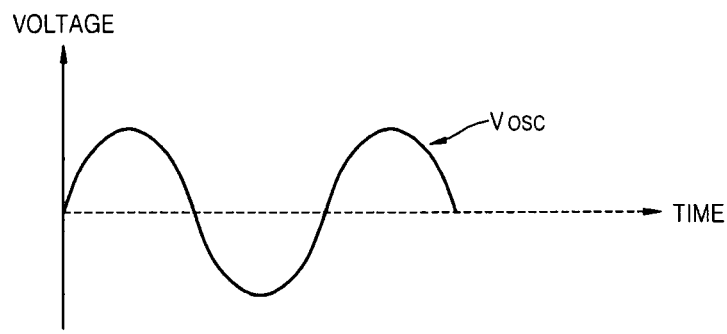
FIG. 18 is a timing diagram illustrating an oscillation signal output from an oscillating unit included in the oscillator of FIG. 17.
Figure 19:
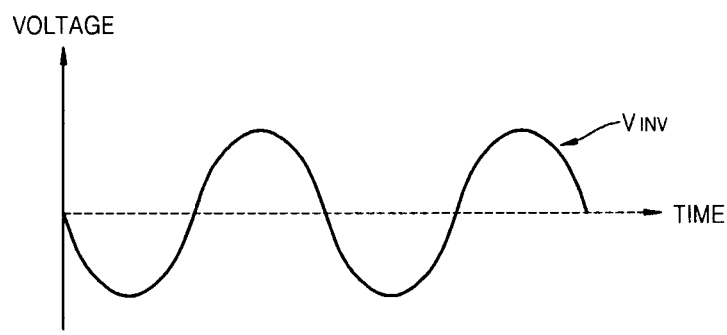
FIG. 19 is a timing diagram illustrating an amplification signal output from a first amplifier included in the oscillator of FIG. 17.
Figure 20:
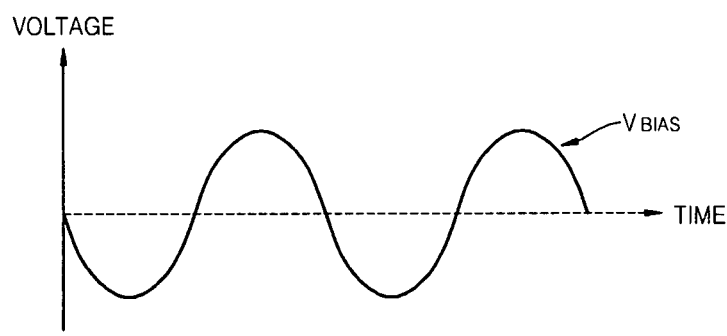
FIG. 20 is a timing diagram illustrating a bias signal output from a bias circuit included in the oscillator of FIG. 17.
Figure 21:
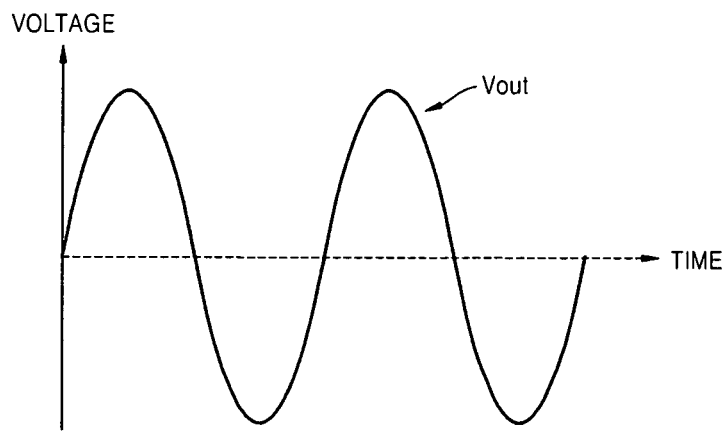
FIG. 21 is a timing diagram illustrating an output signal output from a second amplifier included in the oscillator of FIG. 17.

FIG. 17 is a circuit diagram of an example of the oscillator of FIG. 1 according to example embodiments. FIG. 18 is a timing diagram illustrating an oscillation signal output from an oscillating unit included in the oscillator of FIG. 17. FIG. 19 is a timing diagram illustrating an amplification signal output from a first amplifier included in the oscillator of FIG. 17. FIG. 20 is a timing diagram illustrating a bias signal output from a bias circuit included in the oscillator of FIG. 17. FIG. 21 is a timing diagram illustrating an output signal output from a second amplifier included in the oscillator of FIG. 17.

Referring to FIGS. 17 through 21, an oscillator 1B' is a modification example of the oscillator 1B illustrated in FIG. 12. In detail, a first amplifier 21b' included in the oscillator 1B' according to example embodiments may have a different structure from that of the first amplifier 21b included in the oscillator 1B illustrated in FIG. 12. Thus, the structure of the first amplifier 21b' will be described in detail below, and detailed descriptions of other elements included in the oscillator 1B' will be omitted.

The first amplifier 21b', in an output stage 20b', may include a PMOS transistor PM and a second NMOS transistor NM2 that are serially connected to each other. The PMOS transistor PM may include a gate connected to an oscillation output node N1 of an oscillating unit 10, a source connected to a first voltage terminal, and a drain connected to an amplification node N2. For example, a voltage level of the first voltage terminal may be about 1.8 V. The second NMOS transistor NM2 may include a gate to which a control signal CON2 is applied, a drain connected to the amplification node N2, and a source connected to a second voltage terminal. For example, a voltage level of the second voltage terminal may be a ground voltage, and a voltage level of the control signal CON2 may be about 1.0 V.

The first amplifier 21b' may receive an oscillation signal OSC from the oscillation output node N1 of the oscillating unit 10 and output an inverted amplification signal INV having an inverted phase with respect to the oscillation signal OSC, at the amplification node N2. The inverted amplification signal INV may oscillate as illustrated in FIG. 19, for example, with respect to about 0.86 V.

A bias circuit 22b of the output stage 20b' may include a capacitor C and a first resistor R1, and the capacitor C and the first resistor R1 may be commonly connected to a bias output node N3. In detail, the capacitor C is connected between the amplification node N2 and the bias output node N3 to remove a direct current component from the inverted amplification signal INV. The first resistor R1 is connected between a third voltage terminal and the bias output node N3 to supply a bias signal BIAS that oscillates with respect to a set (or threshold) voltage level.

The bias circuit 22b may receive the inverted amplification signal INV from the amplification node N2 and output the bias signal BIAS, wherein the bias circuit 22b may output the bias signal BIAS by adjusting a standard voltage level of the inverted amplification signal INV, at the bias output node N3. For example, the bias signal BIAS may oscillate as illustrated in FIG. 20.

A second amplifier 23b of the output stage 20b' may include a second resistor R2 and third and fourth NMOS transistors NM3 and NM4, and may amplify the bias signal BIAS to supply an output signal OUT. In detail, the third NMOS transistor NM3 may include a gate that is connected to the bias output node N3 and to which the bias signal BIAS is applied and a drain that is connected to an output node N4. The fourth NMOS transistor NM4 may include a drain that is connected to a source of the third NMOS transistor NM3, a gate to which a control signal CON3 is applied, and a source that is connected to a ground terminal. The fourth NMOS transistor NM4 may supply a current to the third NMOS transistor NM3. The second resistor R2 may be connected between a fourth voltage terminal and the output node N4. A voltage level of the fourth voltage terminal may be the same as a level of a power voltage.

The second amplifier 23b may amplify the bias signal BIAS to a set level to output the output signal OUT having an inverted phase with respect to the bias signal BIAS, at the output node N4. The output signal OUT may oscillate as illustrated in FIG. 21.

Figure 22:
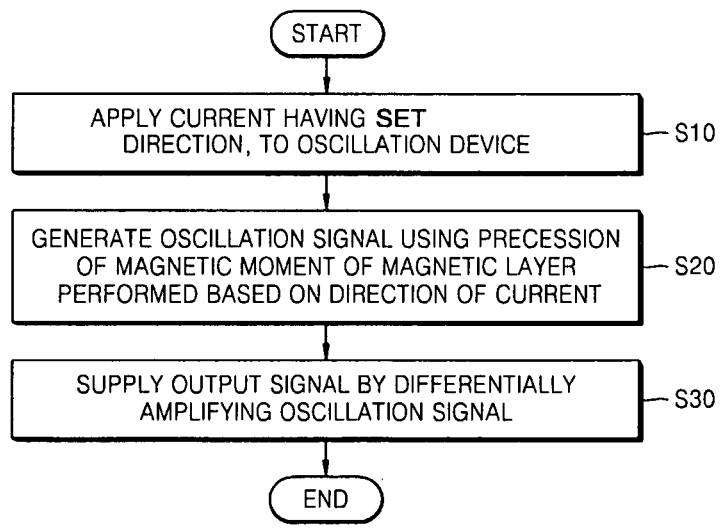
FIG. 22 is a flowchart illustrating a method of operating an oscillator according to example embodiments.

FIG. 22 is a flowchart illustrating a method of operating an oscillator according to example embodiments.

Referring to FIG. 22, the method of operating an oscillator according to example embodiments is the same as methods of operating the oscillators of FIGS. 1 through 21. Accordingly, the descriptions with respect to FIGS. 1 through 21 may be applied to the method of operating an oscillator according to example embodiments.

A current is applied to an oscillation device in a set direction (S10). The oscillation device may include at least one magnetic layer having a magnetization direction that is variable according to at least one selected from the group consisting of an applied current, an applied voltage and an applied magnetic field.

An oscillation signal having a set frequency is generated by using a precession of a magnetic moment of the magnetic layer that occurs according to the direction of the applied current (S20).

The oscillation signal is differentially amplified to provide an output signal (S30). An output stage at which the output signal is provided may be integrated on the same substrate as the oscillation device.

In detail, a non-inverted amplification signal having the same phase as the oscillation signal and an inverted amplification signal having an inverted phase with respect to the oscillation signal are generated. First and second output signals are generated by differentially amplifying the non-inverted amplification signal and the inverted amplification signal. The first and second output signals may be provided as the output signal. The non-inverted amplification signal and the inverted amplification signal with respect to the oscillation signal may substantially have gains near (or about) 1, and gains of the first and second output signals with respect to the oscillation signal may be greater than 1.

Furthermore, first and second bias signals may be provided by adjusting voltage levels of the non-inverted amplification signal and the inverted amplification signal such that the non-inverted amplification signal and the inverted amplification signal oscillate with respect to the same voltage level. Here, by differentially amplifying the first and second bias signals, the first and second output signals may be generated.

According to example embodiments, an oscillating unit and an output stage of an oscillator are integrated on the same substrate, which indicates that the oscillating unit and the output stage may be manufactured using a complementary metal oxide semiconductor (CMOS) manufacturing process and that the manufacturing process is simplified accordingly. Furthermore, a short wiring between the oscillating unit and the output stage may be formed, thereby reducing signal interference between the oscillating unit and the output stage.

Also, by providing an output signal by differentially amplifying an oscillation signal generated in the oscillating unit, a gain of the output signal may be increased, and a signal-to-noise ratio may be increased so that the oscillator may operate in a high frequency band. In addition, by differentially amplifying the oscillation signal generated in the oscillating unit, a measurement error may be reduced compared to when using an single ended output, and a common-mode rejection ratio (CMRR) may be increased.

Also, according to example embodiments, when outputting an oscillation signal generated in the oscillating unit by using a single ended output, an amplifier is formed of n-type metal oxide semiconductor (NMOS) transistors, thereby forming an oscillator to operate at a high speed.

It should be understood that example embodiments described therein should be considered in a descriptive sense only and not for purposes of limitation. Descriptions of features or aspects within each embodiment should typically be considered as available for other similar features or aspects in other embodiments.

What is claimed is:
1. An oscillator, comprising:
an oscillating unit including at least one magnetic layer having a magnetization direction that varies according to at least one selected from the group consisting of an applied current, an applied voltage and an applied mag- netic field, wherein the oscillating unit is configured to generate an oscillation signal having a set frequency; and an output stage that provides an output signal by differentially amplifying the oscillation signal, wherein the output stage is integrated on a substrate on which the oscillating unit is integrated, and the output stage includes a first amplifier including a non-inverting amplifier configured to generate a non-inverted amplification signal having a phase that is the same as that of the oscillation signal, and an inverting amplifier configured to generate an inverted amplification signal having a phase that is inverted from that of the oscillation signal.

2. The oscillator of claim 1, wherein the output stage further includes a second amplifier configured to generate a first output signal and a second output signal by differentially amplifying the non-inverted amplification signal and the inverted amplification signal, wherein the second amplifier provides the first and second output signals as the output signal.

3. The oscillator of claim 2, wherein the output stage further includes a bias circuit configured to provide a first bias signal and a second bias signal by adjusting voltage levels of the non-inverted amplification signal and the inverted amplification signal such that the non-inverted amplification signal oscillates with respect to a voltage level and the inverted amplification signal oscillates with respect to the same voltage level, and the second amplifier differentially amplifies the first and second bias signals to generate the first and second output signals.

4. The oscillator of claim 3, wherein the non-inverting amplifier includes, a first transistor including a gate to which the oscillation signal is applied, a drain connected to a first voltage terminal, and a source connected to a non-inverted output node configured to output the non-inverted amplification signal, and a second transistor serially connected to the first transistor via the non-inverted output node; and the inverting amplifier includes, a third transistor including a gate to which the oscillation signal is applied, a source connected to a second voltage terminal, and a drain connected to an inverted output node configured to output the inverted amplification signal, and a fourth transistor serially connected to the third transistor via the inverted output node.

5. The oscillator of claim 4, wherein the bias circuit includes:

a first bias circuit including a first capacitor connected between the non-inverted output node and a first bias output node, and a first resistor connected to the first bias output node, the first bias circuit being configured to provide the first bias signal at the first bias output node; and a second bias circuit including a second capacitor connected between the inverted output node and a second bias output node, and a second resistor connected to the second bias output node, the second bias circuit being configured to provide the second bias signal at the second bias output node.

6. The oscillator of claim 3, wherein the second amplifier includes:

a first transistor including a gate to which the first bias signal is applied and a drain connected to a first output node;

a second transistor including a gate to which the second bias signal is applied and a drain connected to a second output node;

a first load connected between a power voltage terminal and the first output node;

a second load connected between the power voltage terminal and the second output node; and a third transistor including a drain commonly connected to a source of the first transistor and a source of the second transistor, the third transistor being configured to provide a current to the first and second transistors.

7. The oscillator of claim 1, wherein the oscillating unit includes:

a current source configured to provide the applied current; and at least one oscillation device configured to generate the oscillation signal based on the applied current.

8. The oscillator of claim 7, wherein the at least one oscillation device includes:

a first magnetic layer, wherein the first magnetic layer is the at least one magnetic layer having the magnetization direction that varies according to the at least one selected from the group consisting of the applied current, the applied voltage and the applied magnetic field;

a second magnetic layer having a pinned magnetization direction; and a non-magnetic layer disposed between the first magnetic layer and the second magnetic layer.

9. The oscillator of claim 8, wherein a magnetic moment of the first magnetic layer performs a precession according to the at least one selected from the group consisting of the applied current, the applied voltage and the applied magnetic field such that the at least one oscillation device generates the oscillation signal as a resistance of the at least one oscillation device is periodically changed.

10. The oscillator of claim 8, wherein the second magnetic layer includes:

a first pinned layer disposed adjacent to the non-magnetic layer and has a first magnetization direction;

a separation layer disposed adjacent to the first pinned layer; and a second pinned layer disposed adjacent to the separation layer, the second pinned layer having a second magnetization direction opposite to the first magnetization direction.

11. The oscillator of claim 8, wherein the second magnetic layer includes:

a pinned layer disposed adjacent to the non-magnetic layer; and an anti-ferromagnetic layer disposed adjacent to the pinned layer, wherein a magnetization direction of the pinned layer is pinned in a direction corresponding to a magnetic moment of an uppermost portion of the anti-ferromagnetic layer.

12. An oscillator, comprising:

an oscillating unit including at least one magnetic layer having a magnetization direction that varies according to at least one selected from the group consisting of an applied current, an applied voltage and an applied magnetic field, wherein the oscillating unit is configured to generate an oscillation signal having a set frequency; and an output stage that provides an output signal by amplifying the oscillation signal, wherein the output stage includes a first amplifier configured to amplify the oscillation signal to provide an amplification signal, and a second amplifier configured to amplify the amplified oscillation signal to provide the output signal, wherein the output stage is integrated on a substrate on which the oscillating unit is integrated.

13. The oscillator of claim 12, wherein the output stage further includes a bias circuit that adjusts a voltage level of the amplification signal to provide a bias signal, the bias signal being the amplified oscillation signal, and the second amplifier amplifies the bias signal to provide the output signal.

14. The oscillator of claim 13, wherein the second amplifier includes:

a first n-type metal oxide semiconductor (NMOS) transistor including a gate to which the bias signal is applied and a drain connected to an output node to which the output signal is provided;

a second NMOS transistor including a drain connected to a source of the first NMOS transistor and a source connected to a ground voltage terminal; and a resistor connected between a power voltage terminal and the output node.

15. The oscillator of claim 12, wherein the first amplifier provides a non-inverted amplification signal, which has a phase that is the same as that of the oscillation signal, as the amplification signal.

16. The oscillator of claim 12, wherein the first amplifier provides an inverted amplification signal, which has a phase that is inverted from that of the oscillation signal, as the amplification signal.

17. A method of operating an oscillator, the method comprising:

applying a current to an oscillating unit of the oscillator in a set direction;

generating an oscillation signal having a set frequency by using a precession of a magnetic moment of at least one magnetic layer of the oscillating unit, wherein the magnetic moment occurs according to the direction of the current; and providing an output signal using an output stage of the oscillator by differentially amplifying the oscillation signal, wherein the at least one magnetic layer has a magnetization direction that varies according to at least one selected from the group consisting of an applied current, an applied voltage and an applied magnetic field, wherein the output stage is integrated on a substrate on which the oscillating unit is integrated, and providing the output signal includes, generating a non-inverted amplification signal having a phase that is the same as that of the oscillation signal and an inverted amplification signal having a phase that is inverted from that of the oscillation signal, and generating a first output signal and a second output signal by differentially amplifying the non-inverted amplification signal and the inverted amplification signal and providing the first and second output signals as the output signal.

18. The method of claim 17, wherein providing the output signal further includes providing a first bias signal and a second bias signal by adjusting voltage levels of the non-inverted amplification signal and the inverted amplification signal such that the non-inverted amplification signal oscillates with respect to a voltage level and the inverted amplification signal oscillates with respect to the same voltage level, and the first and second bias signals are differentially amplified to generate the first and second output signals, when providing the first and second output signals as the output signal.

19. The method of claim 17, wherein gains of the non-inverted amplification signal and the inverted amplification signal with respect to the oscillation signal are about 1, and gains of the first and second output signals with respect to the oscillation signal are greater than 1.

* * * * *